United States Patent [19]

Warble

[11] 4,242,586
[45] Dec. 30, 1980

[54] SPECIMEN HOLDER FOR ELECTRON MICROSCOPY AND ELECTRON DIFFRACTION

[75] Inventor: Charles E. Warble, Glen Waverley, Australia

[73] Assignee: Commonwealth Scientific and Industrial Research Organization, Campbell, Australia

[21] Appl. No.: 63,307

[22] Filed: Aug. 2, 1979

[30] Foreign Application Priority Data

Aug. 8, 1978 [AU] Australia .............................. PD5407

[51] Int. Cl.³ ........................ G01N 23/00; G21K 5/08
[52] U.S. Cl. .................................... 250/443; 250/311; 250/451
[58] Field of Search ........................ 250/443, 451, 311

[56] References Cited

U.S. PATENT DOCUMENTS 3,778,621  12/1973  Mikajiri ............................... 250/311
4,162,401  7/1979  King et al. ........................... 250/311

Primary Examiner—Harold A. Dixon
Attorney, Agent, or Firm—Sughrue, Rothwell, Mion, Zinn & Macpeak

[57] ABSTRACT

A specimen holder which in use is supported on three sides in an electron instrument by the arms of a manipulator mechanism and which includes an apertured base structure having three projecting flanges disposed along respective sides of the base structure. The flanges are arranged to be secured to the arms of a manipulator mechanism so that the holder can be tilted by the manipulator. The base structure comprises a first component of thin sheet material secured in superimposition to a pair of mutually spaced but co-planar sub-components of thin sheet material electrically isolated from the first component. These sub-components respectively integrally carry two of said flanges and the sub-components and their flanges are electrically conductive.

16 Claims, 6 Drawing Figures

SPECIMEN HOLDER FOR ELECTRON MICROSCOPY AND ELECTRON DIFFRACTION

BACKGROUND OF INVENTION

This invention relates to specimen holders for use in electron instruments such as, for example, electron microscopes and electron diffraction cameras.

To view or photograph specimens in electron microscopes or electron diffraction cameras it is frequently desirable to tilt the specimen by use of very small manipulating apparatus located within the microscope or camera. It is also desirable for some purposes to vary the temperature of the specimen and for this purpose it has in the past been proposed to thermally couple a holder for the specimen to a bath of liquid nitrogen to reduce the specimen holder's temperature and to locate the specimen on a grid forming part of the specimen holder which can be heated by passing an electrical current through the grid.

In Australian Patent Specification No. 291,412 there is disclosed a mechanism for supporting and tilting a specimen in an electron microscope or diffraction cameras. The mechanism comprises a specimen holder supported at its periphery by three arms, two of which depend from opposite sides of the holder. The specimen holder is supported above a hollow conical stem with the arms extending down the outer periphery of the stem. Actuation means is provided to cause vertical movement of the arms to cause the specimen holder to pivot about a line extending through the two opposite arms at their point of contact with the periphery of the specimen holder. By actuation of each of the arms the specimen holder can be tilted in any direction.

The specimen holder disclosed in Australian Pat. No. 291,412 comprises a milled block in two body parts constructed of thermally and electrically conductive material such as brass and secured so that they are insulated from one another. A fine mesh grid is arranged to extend across the space defined by the arms of the 'U' of the base part, being wedged in a dovetail formed in the body parts of the holder. The specimen is positioned on this grid. At three positions on the periphery of the holder are provided outwardly extending conical lugs which are arranged to be located in apertures provided at the ends of the manipulator arms. Two of the arms are arranged to be coupled to a source of electrical current so that this current can be passed through the arms and through the body portions of the holder so that the grid couples the electrical circuit. By passing a current through the grid it is possible to achieve for instance, temperatures sufficient to melt grids made from palladium or platinum whilst the surrounding temperature is maintained at liquid nitrogen temperature by thermally coupling the holder to a source of liquid nitrogen. The specimen holder is normally covered by an anti-contamination cap having a small aperture therein to allow the passage of an electron beam.

In conventional electron microscopes or diffraction cameras, the objective lens pole piece is of cylindrical symmetry with a central bore of very small diameter normally of the order of 6 mm. It is essential to incorporate the tilting mechanism within the focal plane of this pole piece so that the specimen can be tilted without sacrificing the resolution of the microscope. Accordingly space within the pole piece is at a premium and the tilting mechanism must be of conforming dimensions.

A disadvantage encountered with the specimen holder of the above patent is that, because the holder is milled in two parts from a block of brass, the specimen holder is comparatively thick and bulky which reduces the allowable angle of tilt and also restricts the visibility of the specimen. Furthermore, the construction is very complicated to assemble due to its minute size and in particular, positioning of the projecting conical lugs on the periphery of the body portions is extremely complicated and requires accurate assembly on a mandrel. This assembly has to be very accurate since two of the conical lugs determine the axis about which the specimen holder pivots. A further disadvantage with this type of specimen holder is the location of the grid. Location of the grid within a dovetail by wedging or clamping tends to introduce strains in the grid which can introduce an undesirable image drift or, in certain circumstances, can cause the grid to fail. Clamping the grid by the use of screws necessarily increases the depth of the block in which the screws are located, thus undesirably decreasing the allowable tilt angle due to obstruction as mentioned above and increasing the electrical resistance of contact with the grid. The specimen holder has to be frequently cleaned, normally by ultrasonic techniques.

It is with these problems and disadvantages in mind that the present invention has been devised.

SUMMARY OF INVENTION

According to the present invention there is provided a specimen holder arranged in use to be supported on three sides in an electron instrument by the arms of a manipulator mechanism, the holder comprising a base structure with an aperture therein, the base structure having three projecting flanges which are disposed along respective sides of the base structure and are arranged to be secured to the arms of a manipulator mechanism so that the holder can be tilted by the manipulator, characterised in that the base structure comprises a first component of thin sheet material secured in superimposition to a pair of mutually spaced but co-planar sub-components of thin sheet material electrically isolated from said first component, the sub-components respectively integrally carrying two of said flanges and the sub-components and their flanges being electrically conductive.

Said first component may integrally carry the third flange. The first components may be adhesively secured to the sub-components, the adhesive then acting as an insulator. Alternatively, the first component and the sub-components may be reaction bonded to an intervening wafer of a refractory oxide ceramic acting as an insulator.

In a preferred embodiment, said two flanges are parallel and are each provided with an aperture which is arranged to act as a receptacle for a protrusion formed on the respective arm of the manipulator, which apertures are mutually coaxial to define a pivot axis about which the specimen holder may be tilted in use. Preferably, said flange apertures extend in part into respective inner faces of the sub-components between said two flanges whereby said pivot axis is co-planar with said inner face.

The third flange is advantageously provided with a slot into which is arranged to be located a protrusion formed on the respective arm of the manipulator.

For use in electron instruments, the holder may be provided with an electrically conductive grid bridging the base structure, and preferably being spot-welded to the base structure. Thus, as employed herein and as generally understood in the art, the term "specimen holder" does not require the existence of a grid across the base structure of the holder.

The present invention also embraces a manipulating device for use in a scanning electron microscope or electron diffraction camera incorporating the specimen holder described above.

Two embodiments of the present invention will now be described by way of example only with reference to the accompanying drawings, in which:

DETAILED SPECIFICATION

Figure 1:
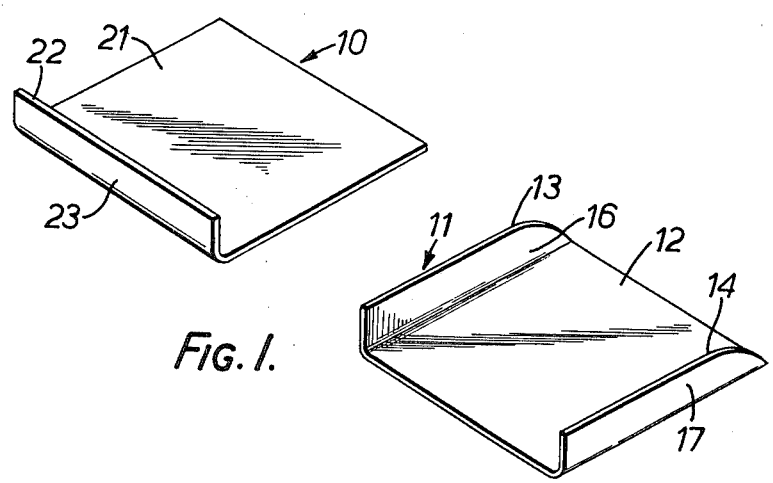
FIG. 1 illustrates two separate prefabricated components of a specimen holder.
Figure 2:
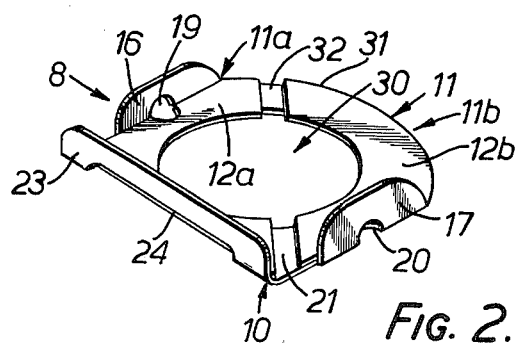
FIG. 2 is a perspective view of a first embodiment of holder in accordance with the present invention.
Figure 3:
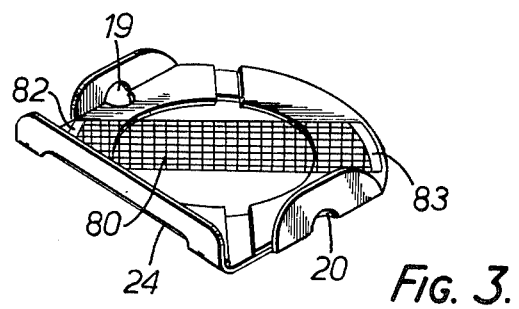
FIG. 3 is a view which is similar to FIG. 2 but shows the specimen grid in position.

The specimen holder 8 illustrated in FIG. 2 comprises two prefabricated components 10 and 11 (FIG. 1) of the sheet material, which is non-magnetic and both electrically and thermally conductive. Suitable materials include sheet platinum, aluminium, brass, phosphor-bronze and palladium. The first component 10 consists of a rectangular base portion 21 which has one edge 22 bent upwardly to provide a flange 23. The second component 11 comprises a rectangular base 12, two opposed edges 13 and 14 of which are bent perpendicular to the base 11 to define parallel flanges 16 and 17. The second component 11 is positioned on top of the first component 10 and the two components are bonded together by use of a suitable adhesive such as AV8 Araldite (Registered Trade Mark) mixed with Al$_2$O$_3$ polishing powder. A few grains of ground glass are also positioned between the two components to ensure the components did not contact one another. The spacing of the components and the adhesive ensures that the two components are electrically insulated from one another.

Having bonded the two components together, a hole 30 is drilled at a central position through the base structure defined by the superimposed bases 12 and 21 of the two components 10 and 11. A slot 32 is then positioned diagonally across the base portion 12 of the second component 11 so that the second component is split into two sub-components 11a, 11b each integrally carrying a flange 16 or 17 but electrically isolated from each other.

Flanges 16 and 17 are provided with a pair of opposed coaxial apertures 19 and 20 which extend in part into the inner faces 12a, 12b of sub-components 11a, 11b between the flanges. These apertures 19, 20 also cut into portion 21 of component 10. Flange 23 is provided with an elongated slot 24 which extends in its transverse dimension into the base portions 12, 21 of both sub-component 11a and component 10.

Finally, specimen holder 8 is trimmed to the profile shown in FIG. 2 by contouring the edge 31 opposite the slotted flange 23 and shortening the end portions of the flanges 16 and 17. The edges of all the flanges are also rounded as shown in FIG. 2.

For use in electron instruments, holder 8 is provided with a fine mesh grid 80 (FIG. 4) of, for example, palladium or platinum, which is spot welded to the base portion 12 of the second component to bridge aperture 30 and electrically connect sub-components 11a, 11b separated by the slot 32. Grid 80 is spot welded at 82, 83 to the sub-components 11a, 11b by means of a very fine carbon electrode and in use supports the specimen under inspection.

Figure 4:
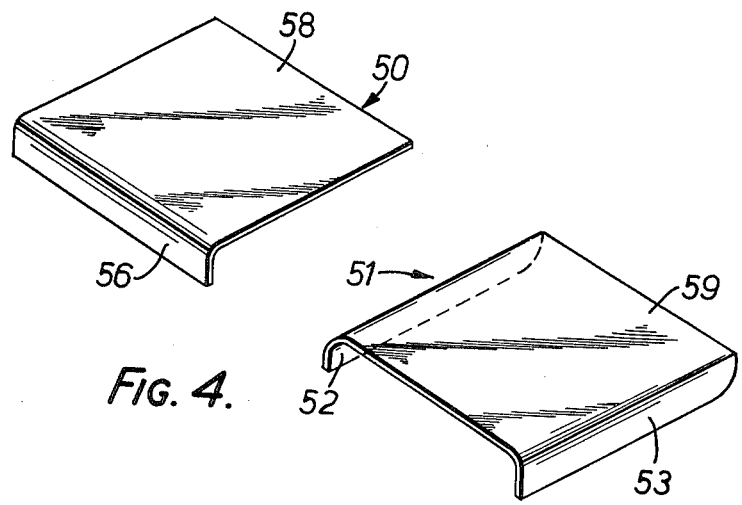
FIGS. 4, 5 and 6 correspond to FIGS. 1, 2 and 3 but depict a second embodiment of specimen holder in accordance with the invention.
Figure 5:
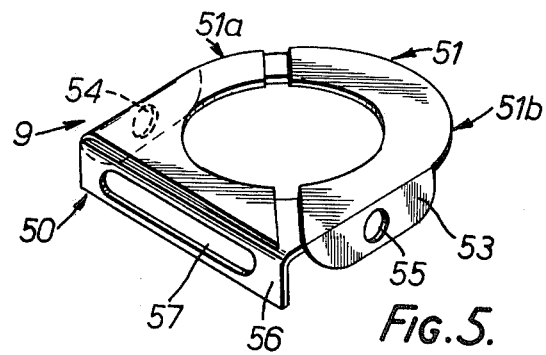
Figure 6:
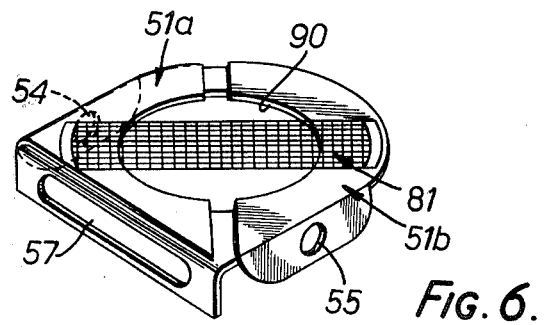

The second embodiment 9 of the invention, illustrated in FIGS. 4 to 6 is broadly similar to the holder 8 and is constructed in a similar manner. However, in this case, the first component 50 is initially superpositioned with its base 58 inside the second component 51 so that the flanges 52 and 53 formed on the sub-components 51a, 51b embrace the base portion 59 of the first component 50. Also, the opposed co-axial apertures 54, 55 in flanges 52, 53 and the slot 57 in flange 56 are disposed wholly within the respective flanges. Grid 81 is outside the holder across base aperture 90.

In situ, the specimen holder 8 or 9 of the present invention is fitted to a three arm manipulating mechanism which functions in a similar manner to that disclosed in Australian Pat. No. 291,412. However, the arms of the mechanism are instead provided with outwardly projecting phospor-bronze hemi-spherical protrusions which respectively locate in the opposed apertures 19, 20 or 54, 55 and in the slot 24 or 57 of the specimen holder. The holder can be variously tilted by selective actuation of the aforesaid arms. In particular, apertures 19, 20 or 54, 55 define a tilt or pivot axis. In the case of holder 8, this axis, and the protrusion centerline at slot 24, can be located substantially in the plane of the inner surface and thus substantially in the plane of the grid 80. In this way, translational movement of the sample is minimised. However, in some cases, greater clearance from the objective aperture is required. Holder 9, in which the pivot axis defined by apertures 54, 55 is offset from the grid, may be used to achieve this additional clearance.

In both embodiments, the base aperture in the second component 11 or 51 is arranged to be smaller than the aperture in the first component 10 or 50. This feature ensures that a portion of the periphery of the aperture of the second component overlaps the first component aperture and shields the insulating adhesive from the electron beam, thus avoiding image distortion from effects due to electrical charging.

As previously mentioned, the arms of the manipulating mechanism are arranged to transmit an electrical current through the phosphor-bronze protrusions to the flanges 16 and 17 or 52 and 53, the circuit being completed by the grid 80, 81 which acts as a resistance heater to enable the specimen positioned thereon to be heated. Furthermore, as disclosed in Australian Pat. No. 291,412, at least one of the arms of the manipulator may be connected to a source of liquid nitrogen so that the surrounding base structure of the specimen holder can be cooled. An anti-contamination cap is typically positioned over the specimen holder when in situ and this cap is provided with a small aperture to allow passage of an electron beam. The positioning of this cap above the specimen holder tends to reduce the space in which the holder is able to tilt and it is for this reason that the edges of the flanges and the free edge 31 of the base portion are cut away to reduce the space that the specimen holder takes up during its tilting motion.

In an examplary holder 8, the two components 10, 11 are respectively fabricated from 0.012" gauge aluminium sheet and from 0.007" gauge platinum sheet. The two components are then bonded together by use of AV8 Araldite (Registered Trade Mark) mixed with $Al_2O_3$ polishing powder with a few grains of ground glass positioned between the opposed surfaces of the two components. After the various forming and prefabricating operations a substantially rectangular structure is provided having an approximate side of 2.5 mm. The thickness of the base structure is in the order of 0.020".

In another examplary holder, both components are constructed out of platinum sheet and when the two components have been bonded together, the thickness of the base structure is 0.17", the side 2.5 mm and the weight 0.020 gm.

The specimen holder described above has a number of important advantages over the specimen holder disclosed in Australian Pat. No. 291,412. In drawing comparisons, it must be appreciated that the overall dimensions of the specimen holders are very small and that FIGS. 1 and 2 illustrate the components magnified by 16 times normal size.

To contrast the holder of the present invention with the milled brass holder disclosed in Australian Pat. No. 291,412, it is notable that the brass holder has approximate dimensions of, overall thickness 0.053", diameter 3 mm and weight 0.05 gm. This holder has solid side walls and does not possess the cutaway flanges of the present invention. The cutaway flanges together with the comparatively thin base structure increase the clearance about the holder so that it may be more easily tilted through 45° without impairing the view of the specimen. A tilt of 45° on each side is, for most purposes, considered entirely satisfactory. Prefabrication of the holder from sheets of thin material make the assembly of the holder a far more simple exercise than the complex milling and machining operations required during the construction of the earlier holder. Furthermore, the use of apertures in the flanges to accommodate male projections in the arms of the manipulator is a much more efficient and practical way to mount the holder on the arms of the manipulator than the accurate location of difficult to machine and assemble lugs on the periphery of the body into apertures in the arms of the manipulator.

The phosphor-bronze hemi-spherical protrusions can be accurately punched in the ends of the arms of the manipulator. It has been found that the spherical surface of these projections together with the apertures in the associated flanges of the specimen holder provide a particularly hard wearing and self-seating support for the holder. Furthermore, on extensive usage the projections tend to wear corresponding spherical surfaces in the periphery of the apertures in the flanges thereby also improving electrical contact as well as location of the holder on the arms of the manipulator. The slot in the third flange also accommodates a phosphor-bronze projection formed on the end of the manipulator arm and relative movement of this member within the slot enables free kinematic tilting of the specimen holder in all directions.

Spot welding the specimen support grid to the base structure of the conductive sub-components is the preferred manner of mounting the grid. The support grid must be of very small resistance (in the order of 0.1 ohm) and only carries a current of approximately 1½ amps. The use of other securing techniques such as fasteners tends to substantially increase the overall resistance of the support grid and therefore reduces its effectiveness. It has been found that the spot welding technique keeps the overall resistance low, whilst at the same time, satisfactorily secures the grid to the base structure of the holder so that if desired both grid and holder can be ultrasonically cleaned and used again. The various previous techniques of retaining the grid introduced a number of problems such as increase in resistance and an introduction of strain into the grid on the tightening of associated fastening means. The ability to reuse the more expensive grids is a distinct advantage. Simple spot welding substantially overcomes all these disadvantages.

I claim:

1. A specimen holder arranged in use to be supported on three sides in an electron instrument by the arms of a manipulator mechanism, the holder comprising a base structure with an aperture therein, the base structure having three projecting flanges which are disposed along respective sides of the base structure and are arranged to be secured to the arms of a manipulator mechanism so that the holder can be tilted by the manipulator, characterised in that the base structure comprises a first component of thin sheet material secured in superimposition to a pair of mutually spaced but co-planar sub-components of thin sheet material electrically isolated from said first component, the sub-components respectively integrally carrying two of said flanges and the sub-components and their flanges being electrically conductive.

2. A specimen holder according to claim 1, wherein said first component integrally carries the third flange.

3. A specimen holder according to claims 1 or 2 wherein the first component is adhesively secured to the sub-components, the adhesive acting as an insulator.

4. A specimen holder according to claims 1 or 2 wherein the first component and the sub-components are reaction bonded to an intervening wafer of a refractory oxide ceramic acting as an insulator.

5. A specimen holder according to claim 1 or 2 wherein the first component is provided with an opening and the sub-components with opposed cut-outs so that, when the components are secured together, said opening and said cut-outs match to define the aperture of the base structure, the opening of the first component being larger than the opening formed by said cut-outs.

6. A specimen holder according to claim 1 or 2 wherein said two flanges are parallel and are each provided with an aperture which is arranged to act as a receptacle for a protrusion formed on the respective arm of the manipulator, which apertures are mutually coaxial to define a pivot axis about which the specimen holder may be tilted in use.

7. A specimen holder according to claim 6 wherein said flange apertures extend in part into respective inner faces of the sub-components between said two flanges whereby said pivot axis is co-planar with said inner face.

8. A specimen holder according to claim 7 wherein the outer faces of the sub-components are secured to the first component.

9. A specimen holder according to claim 6 wherein said flange apertures lie wholly within their respective flanges whereby said pivot axis is offset from the inner and outer faces of the sub-components.

10. A specimen holder according to claim 9 wherein the inner faces of the sub-components are secured to the first component.

11. A specimen holder according to claim 6 wherein the third flange is provided with a slot into which is arranged to be located a protrusion formed on the respective arm of the manipulator.

12. A specimen holder according to claim 11 wherein the three flanges extend perpendicularly to the base structure, said two flanges also extending perpendicularly to the third.

13. A specimen holder according to claim 6 wherein an electrically conductive grid bridges said base structure aperture and is secured thereto.

14. A specimen holder according to claim 13, wherein the grid is spot-welded to the base structure.

15. A specimen holder according to 1 or 2 wherein the flanges are bent edge portions of the respective component or sub-components.

16. A specimen holder according to claim 1 or 2 wherein the components are constructed of non-magnetic material(s) having high thermal and electrical conductivity.

* * * * *